United States Patent
Hou

(10) Patent No.: US 10,546,904 B2
(45) Date of Patent: Jan. 28, 2020

(54) PIXEL DEFINING LAYER HAVING PIXEL DEFINING SUB-LAYERS

(71) Applicant: BOE TECHNOLOGY GROUP CO., LTD., Beijing (CN)

(72) Inventor: Wenjun Hou, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 15/992,042

(22) Filed: May 29, 2018

(65) Prior Publication Data

US 2019/0165059 A1 May 30, 2019

(30) Foreign Application Priority Data

Nov. 27, 2017 (CN) .......................... 2017 1 1221727

(51) Int. Cl.
*H01L 27/32* (2006.01)
*H01L 27/12* (2006.01)
*H01L 51/00* (2006.01)

(52) U.S. Cl.
CPC .......... *H01L 27/3246* (2013.01); *H01L 27/12* (2013.01); *H01L 51/0005* (2013.01); *H01L 27/3283* (2013.01)

(58) Field of Classification Search
CPC . H01L 27/3246; H01L 27/12; H01L 27/3283; H01L 27/3295; H01L 51/0005
See application file for complete search history.

(56) References Cited

U.S. PATENT DOCUMENTS

| 7,754,275 | B2* | 7/2010 | Mitsuhashi | ......... | H01L 27/3246 427/271 |
| 9,035,330 | B2* | 5/2015 | Kang | .................. | H01L 27/3246 257/100 |
| 9,972,665 | B2* | 5/2018 | Wang | ...................... | H01L 51/56 |
| 2003/0175414 | A1* | 9/2003 | Hayashi | .................. | B41J 2/145 427/66 |
| 2005/0140274 | A1* | 6/2005 | Lee | ..................... | H01L 27/3223 313/504 |
| 2005/0174043 | A1* | 8/2005 | Kiguchi | ................. | G02B 5/201 313/503 |
| 2007/0018152 | A1* | 1/2007 | Seki | .................... | H01L 27/3223 257/40 |
| 2007/0072004 | A1* | 3/2007 | Sakai | .................. | H01L 51/0003 428/690 |

(Continued)

*Primary Examiner* — Ida M Soward
(74) *Attorney, Agent, or Firm* — Kinney & Lange, P.A.

(57) ABSTRACT

Provided is a pixel defining layer for pixels formed by ink jet printing, an array substrate and a display apparatus. The pixel defining layer comprises a first pixel defining sub-layer, which defines a plurality of uniformly distributed pixels; and a second pixel defining sub-layer on the first pixel defining sub-layer, wherein the second pixel defining sub-layer and the first pixel defining sub-layer together define a plurality of ink-holding spaces for the plurality of uniformly distributed pixels respectively, and wherein a width of the first pixel defining sub-layer is not less than a width of the second pixel defining sub-layer thereon, wherein the pixel defining layer is divided into an active area zone and an dummy zone outside the active area zone, and wherein an ink-holding space of a pixel in the dummy zone is larger than an ink-holding space of a pixel in the active area zone.

9 Claims, 2 Drawing Sheets

(56) References Cited

U.S. PATENT DOCUMENTS

| | | | |
|---|---|---|---|
| 2007/0252525 A1* | 11/2007 | Seki | H01L 27/3246 313/509 |
| 2012/0181553 A1* | 7/2012 | Ono | H01L 27/3246 257/88 |
| 2014/0233843 A1* | 8/2014 | Cocca | G06T 7/0004 382/145 |
| 2016/0079323 A1* | 3/2016 | Choi | H01L 27/3246 257/40 |
| 2017/0040393 A1* | 2/2017 | Onimaru | H01L 27/3246 |
| 2017/0133357 A1* | 5/2017 | Kuo | H01L 25/167 |
| 2018/0138255 A1* | 5/2018 | Lee | H01L 51/0005 |

\* cited by examiner

PIXEL DEFINING LAYER HAVING PIXEL DEFINING SUB-LAYERS

CROSS REFERENCE TO RELATED APPLICATION

This application claims the priority of Chinese Patent Application No. 201711221727.2 filed on Nov. 27, 2017, which is incorporated herein in its entirety by reference.

TECHNICAL FIELD

This disclosure relates to the field related to display, in particular, to a pixel defining layer, an array substrate and a display apparatus.

BACKGROUND

As compared with LCDs, organic electroluminescent devices (OLEDs) have advantages, such as self luminescence, fast response, wide visual angle, high brightness, vivid color, being light and thin, and the like. OLEDs are considered as the next generation of display technology.

The organic light-emitting layer of an OLED may be formed by an ink jet process. In particular, the ink containing an organic light-emitting material is sprayed to a pixel region surrounded by a pixel defining layer by ink jet, so as to form the organic light-emitting layer after drying.

Improvement is still needed for the pixel defining layer.

SUMMARY

In an aspect, this disclosure provides a pixel defining layer for pixels formed by ink jet printing, comprising:

a first pixel defining sub-layer, which defines a plurality of uniformly distributed pixels; and a second pixel defining sub-layer on the first pixel defining sub-layer, wherein the second pixel defining sub-layer and the first pixel defining sub-layer together define a plurality of ink-holding spaces for the plurality of uniformly distributed pixels respectively, and wherein a width of the first pixel defining sub-layer is not less than a width of the second pixel defining sub-layer thereon, wherein the pixel defining layer is divided into an active area zone and an dummy zone outside the active area zone, and wherein an ink-holding space of a pixel in the dummy zone is larger than an ink-holding space of a pixel in the active area zone.

Optionally, in the minor axis direction or major axis direction of the pixels, the distance between adjacent second pixel defining sub-layers in the dummy zone is larger than the distance between adjacent second pixel defining sub-layers in the active area zone.

Optionally, in the minor axis direction or major axis direction of the pixels, a width of the second pixel defining sub-layer in the dummy zone is less than a width of the second pixel defining sub-layer in the active area zone.

Optionally, in the minor axis direction, a width of the first pixel defining sub-layer and a width of the second pixel defining sub-layer in the active area zone has a difference ranging from 1 to 3 µm, and a width of the first pixel defining sub-layer and a width of the second pixel defining sub-layer in the dummy zone has a difference ranging from 3 to 10 µm.

Optionally, in the major axis direction of the pixels, a width of the first pixel defining sub-layer and a width of the second pixel defining sub-layer in the active area zone has a difference ranging from 1 to 3 µm, and a width of the first pixel defining sub-layer and a width of the second pixel defining sub-layer in the dummy zone has a difference ranging from 3 to 20 µm.

Optionally, a width of the first pixel defining sub-layer is larger than or equal to 15 µm.

Optionally, the pixel number in the dummy zone in the direction perpendicular to the periphery is 1.

Optionally, the first pixel defining sub-layer is an inorganic pixel defining sub-layer having lyophilicity, and the second pixel defining sub-layer is an organic pixel defining sub-layer having lyophobicity.

Optionally, the material of the inorganic pixel defining sub-layer comprises one or more of silica, silicon nitride and silicon oxynitride, and the material of the organic pixel defining sub-layer comprises one or more of fluorinated polyimide, fluorinated polymethyl methacrylate, polysiloxane and a silicone resin.

Optionally, a width and a height of the first pixel defining sub-layer in the dummy zone are equal to a width and a height of the first pixel defining sub-layer in the active area zone, respectively, and a width and a height of the second pixel defining layer in the dummy zone are equal to a width and a height of the second pixel defining layer in the active area zone, respectively.

In another aspect, this disclosure provides an array substrate, comprising the pixel defining layer mentioned above.

Optionally, the pixels in the dummy zone are dummy pixels.

In still another aspect, this disclosure provides a display apparatus, comprising the array substrate mentioned above.

Optionally, the pixels in the dummy zone are shielded by a frame.

DETAILED EMBODIMENTS

In order to make the purposes, technical solutions and advantages more clear, this disclosure is further described in details by incorporating specific examples and referring to drawings.

It should be explained that all expressions using "first" and "second" in examples of this disclosure are used to distinguish two different entities or parameters having the same name. Therefore, "first" and "second" are used for convenience in expression, and they should not be understood as limitations to examples of this disclosure. Explanation thereto is not repeated in each of the examples below.

Typically, a pixel defining layer is a grid structure consisting of walls, wherein the walls may be walls in two directions perpendicular to each other. In this disclosure, "a pixel defining layer/sub-layer" and walls thereof are not distinguished specifically. For example, in this disclosure, "a width/height of a pixel defining layer/sub-layer" refers to a width/height of a wall of a pixel defining layer/sub-layer; a "distance between adjacent pixel defining layers/sub-layers" refers to a distance between adjacent walls of a pixel defining layer/sub-layer; a "position of a pixel defining layer/sub-layer" may refer to a position of a wall of a pixel defining layer/sub-layer.

In an ink jet printing process, the drying rate of the solvent at the edge of the ink jet printing zone is faster than that in the center zone. In order to ensure the film formation uniformity among the pixels and the corresponding uniformity of the brightness of the device, dummy pixel may be configured in the edge zone. That is to say, the same ink is printed in the dummy pixels as that used in the active area zone, but the dummy pixels will not emit light when the device is lighted up.

In order to satisfy the above-mentioned design, generally a plurality of dummy pixels are needed to be provided in the edge zone, to allow the film formation uniform. However, this will result in that the corresponding frame in the edge zone takes up a relatively large area, which is adverse to the current demand on the narrow-frame design.

In the process of completing this disclosure, the inventor discovers that in the related art there is at least the problem that it is hard for the current design of the dummy pixel structure to satisfy the demand on the narrow-frame design while achieving film formation uniformity.

Currently, the market of display apparatus seeks a high screen-to-body ratio. For this purpose, the pixels in the dummy zone should be reduced, to satisfy the corresponding narrow-frame design. In this disclosure, the volume of ink in the pixel in the dummy zone is controlled by controlling the size of the pixel in the dummy zone, and thus the purpose of controlling the film formation uniformity in the opening region in the pixel is achieved.

Figure 1:
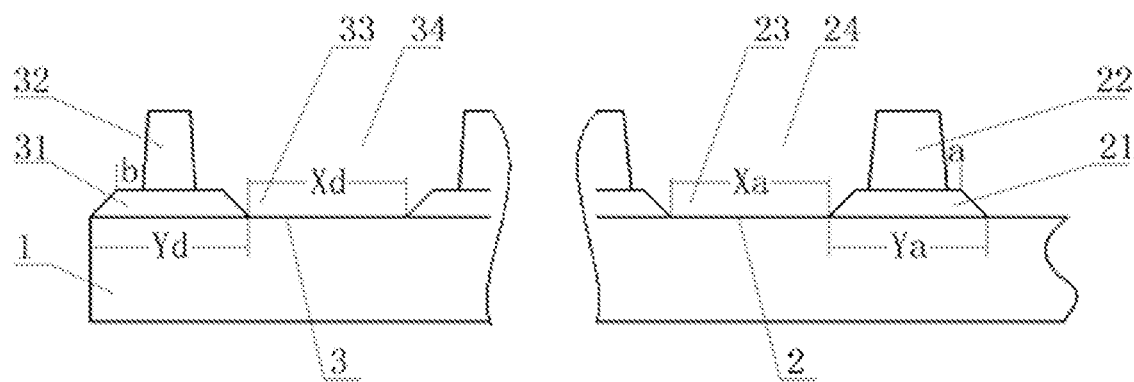
FIG. 1 is a schematic structural drawing of an example of a pixel defining layer provided in this disclosure.

Referring to FIG. 1, which is a schematic structural drawing of an example of a pixel defining layer provided in this disclosure, a pixel defining layer is generally provided on a base substrate 1 to distinguishing and defining pixel units. Specifically, the pixel defining layer consists of a double-layered material, including a first pixel defining sub-layer (21, 31) and a second pixel defining sub-layer (22, 32) provided on the first pixel defining sub-layer (21, 31). Optionally, the first pixel defining sub-layer (21, 31) is an inorganic pixel defining sub-layer having lyophilicity, wherein the material is one or more of silica, silicon nitride and silicon oxynitride. Optionally, the second pixel defining sub-layer (22, 32) is an organic pixel defining sub-layer having lyophobicity, wherein the material is one or more of fluorinated polyimide, fluorinated polymethyl methacrylate, polysiloxane and a silicone resin.

With respect to the pixels defined by the pixel defining layer, the pixel defining layer is divided into an active area zone 2 and an dummy zone 3 (i.e. edge zone) outside the active area zone 2, according to the different functions, or according to the different positions. The pixel units in the active area zone serves to emit light, while the pixel units in the dummy zone do not emit light and may be located in the frame zone in the final display panel.

In this disclosure, a pixel may refer to the concave surrounded by the pixel defining layer, in which a light-emitting material is deposited. Sometimes, "pixel" and "sub-pixel" are used interchangeably. A "pixel unit" refers to a unit comprising one or more "pixels" or "sub-pixels".

In this disclosure, the first pixel defining sub-layer defines a plurality of uniformly distributed pixels, that is to say, to form a uniform pixel array. This is beneficial for performing an ink jet process.

In this disclosure, there is a second pixel defining sub-layer on the first pixel defining sub-layer. The second pixel defining sub-layer and the first pixel defining sub-layer together define a plurality of ink-holding spaces for the plurality of uniformly distributed pixels, respectively. When the ink is printed by ink jet, the ink is hold in the ink-holding space. Generally, as the ink is dried, finally the light-emitting material and the like will be deposited in the pixel defined by the first pixel defining sub-layer.

The width of the second pixel defining sub-layer is less than or equal to the width of the first pixel defining sub-layer under it, so that the ink-holding space will not have a narrow entrance. It should be understood that the pixel defining sub-layers at the top and at the bottom in this disclosure do not always have the same width. For example, the section thereof may be a trapezoid. In this case, the width may be the average width thereof or the width at half height.

In this disclosure, the ink-holding space of the pixel in the dummy zone is larger than the ink-holding space of the pixel in the active area zone. In the same area, the dummy pixel in the dummy zone may hold more ink. Therefore, for holding the same amount of ink, the number of the dummy pixels needed in the dummy zone of this disclosure may be less, and thus the area taken up by them is less.

The above-mentioned requirement for the ink-holding space may be satisfied by various designs.

For example, the width of the second pixel defining sub-layer 32 in the dummy zone 3 is less than the width of the second pixel defining sub-layer 22 in the active area zone 2, in order to allow the opening region 34 between the second pixel defining sub-layer 32 in the dummy zone 3 being larger than the opening region 24 between the second pixel defining sub-layer 22 in the active area zone 2. Herein, the opening region corresponding to a sub-pixel is provided in the pixel defining layer, and at least one sub-pixel forms a pixel unit. The width of the second pixel defining sub-layer (22, 32) is the width in the direction, in which the adjacent sub-pixels in the same pixel unit are connected. Thus, during performing the ink jet printing, the opening region 34 corresponding to the dummy zone 3 may hold more ink than the opening region 24 corresponding to the active area zone 2. Further, even though the drying rate of the ink in the dummy zone at the edge of the panel is faster, there will not be the problem of the nonuniformity of the film formation, because the dummy zone in this disclosure may hold more ink, or in other words, because the unbalance caused by the higher drying rate may be reduced. As compared with the related art, where a plurality of parallel arranged dummy pixels are provided in the dummy zone 3 to achieve the effect of uniform film formation, the uniform film formation may be achieved by that the volume of ink hold in the corresponding opening regions in the dummy pixels in the dummy zone 3 is increased. Thus, the number of dummy pixels may be greatly decreased. That is, the number of the dummy pixel units in the corresponding edge zone may be reduced, to achieve the narrow-frame design.

In addition to increasing the ink-holding space by reducing the width of the second pixel defining sub-layer, it is also possible to increase the ink-holding space by changing the position of the second pixel defining sub-layer.

In other words, there may be various specific design manners for the second pixel defining sub-layer to achieve the purpose of increasing the ink-holding space in the dummy pixel.

Figure 3:
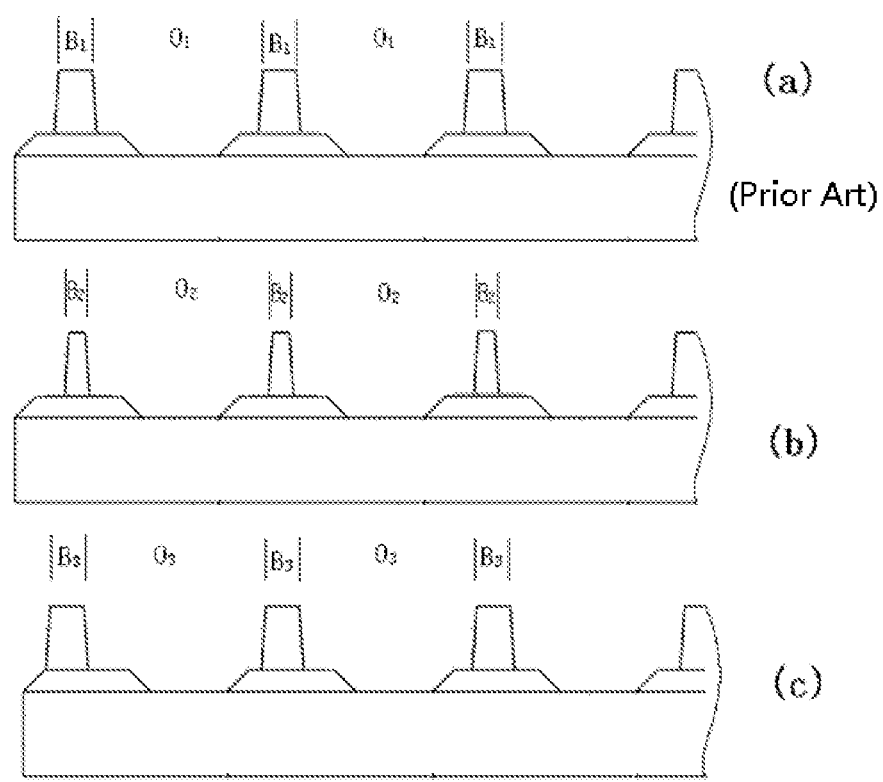
FIG. 3 is a schematic structural drawing of an example of a pixel defining layer provided in this disclosure.

Some examples are shown in FIG. 3 including FIGS. 3 (*a*) to (*c*). FIG. 3 shows section views of pixel defining layers in the dummy zone. FIG. 3 (*a*) is a conventional design of the pixel defining layer in the dummy zone, wherein the structure of the pixel defining layer is the same as that in the active area zone. Herein, the width of the second pixel defining sub-layer is $B_1$, and the width of the opening is $O_1$, same as those in the active area zone. In FIG. 3 (b), the pixel defining layer in the active area zone is the same as in FIG. 3 (a). However, a larger opening $O_2>O_1$ is obtained by a relatively narrower width of the second pixel defining sub-layer $B_2<B_1$, to hold a larger ink-holding space. In FIG. 3 (c), the pixel defining layer in the active area zone is the same as in FIG. 3 (a). However, the relative position of the second pixel defining sub-layer is gradually moved to the edge of the dummy zone by changing the position of the second pixel defining sub-layer with respect to the first pixel defining sub-layer. Thus, a larger opening $O_3>O_1$ may be obtained, without changing the width thereof $B_3=B_1$, to increase the ink-holding space. A person skilled in the art may also envisage another design manner for increasing the opening region, such as a manner in which FIG. 3 (b) is combined with FIG. 3 (c).

Figure 2:
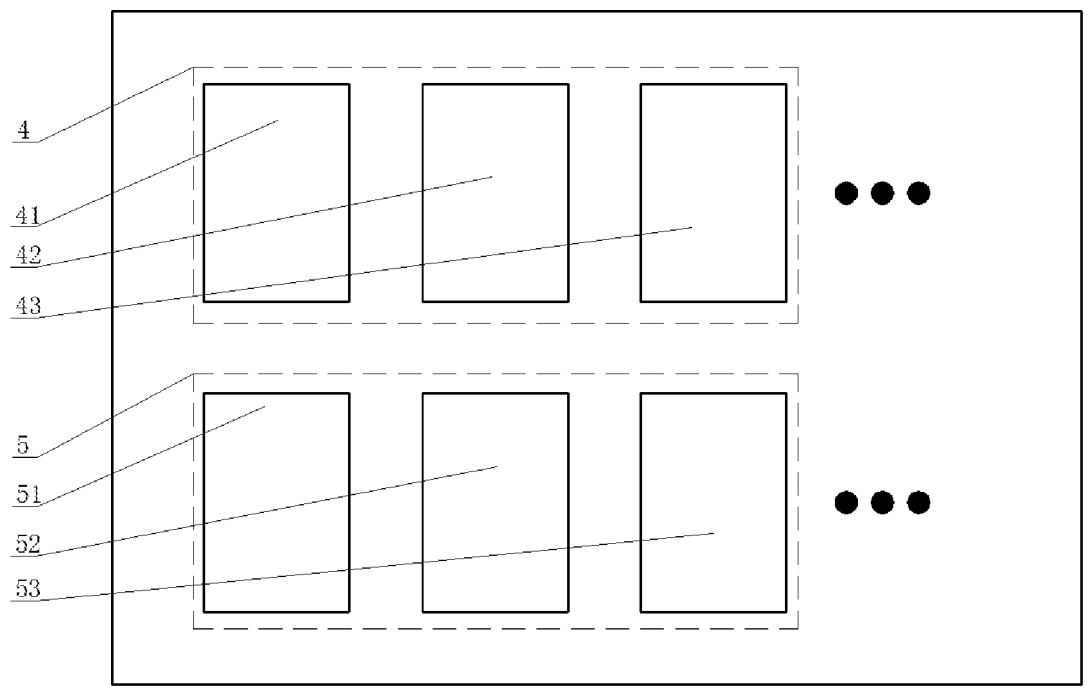
FIG. 2 is a schematic structural drawing of an example of a pixel unit provided in this disclosure.

In particular, referring to FIG. 2, which is a schematic structural drawing of an example of a pixel unit provided in this disclosure, each opening region formed in the pixel defining layer corresponds to a sub-pixel. Herein, the first pixel unit 4 comprises a first sub-pixel 41, a second sub-pixel 42 and a third sub-pixel 43, and the second pixel unit 5 comprises a fourth sub-pixel 51, a fifth sub-pixel 52 and a sixth sub-pixel 53. Generally speaking, the distance between the laterally adjacent sub-pixels in a pixel unit is less than the distance between the vertically adjacent pixel units. Generally, when the overflowing problem of ink is considered, only the shorter distance in the design is needed to be considered. Therefore, in this example, the widths of the first pixel defining sub-layer and the second pixel defining sub-layer refer to the width in the direction, in which the adjacent sub-pixels are connected. For example, the width is the distance between the first sub-pixel 41 and the second sub-pixel 42. Certainly, it should be noticed that if the pixel unit only comprises one sub-pixel, or if the distances of the adjacent pixel units in the lateral direction and in the vertically direction in the figure are close, or if the distance is relatively important in one direction, the width of the pixel defining layer in this example may also adjusted correspondingly. For example, the width may also be the distance between the first sub-pixel 41 and the fourth sub-pixel 51.

In this disclosure, the terms "minor axis" and "major axis" are used to indicate directions. Typically, a pixel is rectangle. In this disclosure, the direction of the long side is referred to as the major axis direction, and the direction of the short side is referred to as the minor axis direction. In these two directions, the thickness of the pixel defining layer (or sub-layer) between adjacent pixels is referred to as the width.

As can be known from the above examples, in the pixel defining layer of this disclosure, the width of the second pixel defining sub-layer in the dummy zone is set to be less than the width of the second pixel defining sub-layer in the active area zone, so that the opening region in the dummy zone (i.e. the edge zone) is allowed to be larger than the opening region in the active area zone. Thus, during an ink jet printing process, more solvent, i.e. ink, may be hold in the dummy zone. Further, the problem that the drying rate of the solvent in the dummy zone is faster may be solved. That is to say, the structure of the pixel defining layer in this disclosure may achieve the purpose of achieving uniform film formation by using fewer pixels in the dummy zone. In other words, the number of dummy pixels at the edge positions may be relatively reduced. Therefore, the pixel defining layer in this disclosure may reduce the number of the dummy pixels in the edge zone. Further, a narrow-frame design may be achieved, while the uniformity of the film formation is ensured.

In some optional examples of this disclosure, the width and height of the first pixel defining sub-layer 31 in the dummy zone 3 are equal to the width and height of the first pixel defining sub-layer 21 in the active area zone 2, so that the size of the opening region 33 corresponding to the first pixel defining sub-layer 31 in the dummy zone 3 is equal to the size of the opening region 23 corresponding to the first pixel defining sub-layer 21 in the active area zone 2. Thus, reducing the width of the second pixel defining sub-layer in the dummy zone is equivalent to enlarging the opening of the pixel. Therefore, the number of the dummy pixels may be reduced, so that a stable and effective narrow-frame design may be achieved.

During design in practice, referring to FIG. 1, the influence factors needed to be considered in designing the width Xa of the opening between the first pixel defining sub-layer are the resolution and the property of the materials. However, the influence factor needed to be considered in designing the width Ya of the first pixel defining sub-layer is the overflow ability of the ink printed by ink jet. In the related art, Xa and Ya may be designed to be the same.

More specifically, an 80 ppi substrate is used as an example for illustration.

Provided that the width of a pixel unit is 314.16 μm and the width of a sub-pixel is 104.72 μm, Ya is larger than or equal to 15 μm, in order to prevent the ink to overflow into the adjacent sub-pixel over the width Ya of the first pixel defining sub-layer.

The resolution of the width Xa of the opening between the first pixel defining sub-layers determines the distance between the pixel units and the distance between the sub-pixels. However, the area of the opening of the sub-pixel is determined by the material property. The reason is that the materials of R, G and B are different. In a common case, the material property of B is the worst. Therefore, the area of the opening thereof is the largest. The areas of the openings of G and R decrease sequentially. The calculated design size Xa of the opening of B is 104.72 μm–15 μm=88.72 μm, and the design size Xas of G and R decrease sequentially.

In a practical design of the 80 ppi substrate, Xa may be selected as 75 μm. That is to say, Ya is 104.72 μm–75 μm=29.72 μm.

In the pixel defining layer, the width Yd and height Ha of the first pixel defining sub-layer in the active area zone are the same as the width Ya and height Ha of the first pixel defining sub-layer in the dummy zone, respectively. That is to say, Yd=Ya, and Hd=Ha. For the same reason, the sizes of the corresponding openings are also the same. The width of the second pixel defining sub-layer 32 in the dummy zone is less than the width of the second pixel defining sub-layer 22 in the active area zone in this disclosure, or in other words, the width b of the exposed first pixel defining sub-layer in the dummy zone is larger than the width a of the exposed first pixel defining sub-layer in the active area zone, i.e. b>a. Thus, in the ink jet printing, the volume of ink printed in a pixel in the dummy zone is larger than the volume of ink printed in a pixel in the active area zone.

Additionally, the pixel defining layer in a display device is generally of a rectangle. Therefore, generally, the direction of the connection between the sub-pixels in the same pixel unit is set as the lateral direction, while the direction perpendicular to the lateral direction is set as the vertical direction. For these two directions, different design sizes are used. Specifically, in the lateral direction, the width of the first pixel defining sub-layer and the width of the second pixel defining sub-layer in the active area zone has a difference ranging from 1 to 3 µm; and the width of the first pixel defining sub-layer and the width of the second pixel defining sub-layer in the dummy zone has a difference ranging from 3 to 10 µm. In the vertical direction, the width of the first pixel defining sub-layer and the width of the second pixel defining sub-layer in the active area zone has a difference ranging from 1 to 3 µm; and the width of the first pixel defining sub-layer and the width of the second pixel defining sub-layer in the dummy zone has a difference ranging from 3 to 20 µm.

The number of the dummy pixels is related to the thickness required by the corresponding display device and the volatile property of the ink. The thickness may be the thickness of the hole injection layer, the hole transfer layer and the light-emitting layer. Generally, when the corresponding display device is designed to utilize the first optical antinode, the required thickness is less. For example, the thickness is 30 nm. Then the number of the dummy pixel units is 2 to 3. Correspondingly, the number of the sub-pixels is 6 to 9. When the corresponding display device is designed to utilize the second optical antinode, the required thickness is larger. For example, the thickness is 100 nm. Then the number of the dummy pixel units is 4 to 6. Correspondingly, the number of the sub-pixels is 12 to 18.

However, in this disclosure, by means of the design of the above-mentioned dummy pixel structure, the dummy pixel number in the dummy zone in the direction perpendicular to the periphery (i.e. the direction from inside to outside) may be reduced to 1. That is to say, the width of the frame may be reduced by the width of 2 to f pixels. For example, in the design of the 80 ppi substrate mentioned above, the frame may be reduced by a width of 0.5-1.5 mm.

In some optional examples of this disclosure, an array substrate is disclosed, wherein the array substrate comprises the pixel defining layer in any of the examples above.

In some optional examples of this disclosure, a display apparatus is disclosed, wherein the display apparatus comprises the array substrate in any of the examples above.

Therefore, the pixel defining layer proposed in this disclosure may be used in the corresponding array substrate or display apparatus in the corresponding field of display. Certainly, the specific application scope of the pixel defining layer is not limited in this disclosure.

As can be known from above, in the pixel defining layer, array substrate and display apparatus provided by this disclosure, the width of the second pixel defining sub-layer in the dummy zone is set to be less than the width of the second pixel defining sub-layer in the active area zone, so that the opening region in the dummy zone (i.e. the edge zone) is allowed to be larger than the opening region in the active area zone. Thus, during an ink jet printing process, more solvent, i.e. ink, may be hold in the dummy zone. Further, the problem that the drying rate of the solvent in the dummy zone is faster may be solved. That is to say, the structure of the pixel defining layer in this disclosure may achieve the purpose of achieving uniform film formation by using fewer pixels in the dummy zone. In other words, the number of dummy pixels at the edge positions may be relatively reduced. Therefore, the pixel defining layer, array substrate and display apparatus in this disclosure may reduce the number of the dummy pixels in the edge zone. Further, a narrow-frame design may be achieved, while the uniformity of the film formation is ensured.

A person skilled in the art should understand that any of the examples discussed above is only illustrative and does not intend to imply that the scope (including the claims) of this disclosure is limited to these examples. In the concept of this disclosure, the technical features in an example or different examples above may be combined. The steps may be performed in any order. Further, there are other variations in different aspects of the disclosure mentioned above.

The examples of this disclosure intend to involve all replacements, modification and variations falling within the broad range of the claims below. Therefore, any omitting, variation, equivalent replacement or modification in the scope and principle of this disclosure should be included in the protection scope of this disclosure.

The invention claimed is:

1. A pixel defining layer for pixels formed by ink jet printing, comprising:
   a first pixel defining sub-layer, which defines a plurality of uniformly distributed pixels; and
   a second pixel defining sub-layer on the first pixel defining sub-layer, wherein the second pixel defining sub-layer and the first pixel defining sub-layer together define a plurality of ink-holding spaces for the plurality of uniformly distributed pixels respectively, and wherein a width of the first pixel defining sub-layer is not less than a width of the second pixel defining sub-layer thereon,
   wherein the pixel defining layer is divided into an active area zone and a dummy zone outside the active area zone,
   wherein an ink-holding space of a pixel in the dummy zone is larger than an ink-holding space of a pixel in the active area zone,
   wherein a width and a height of the first pixel defining sub-layer in the dummy zone are equal to a width and a height of the first pixel defining sub-layer in the active area zone, respectively, and a width and a height of the second pixel defining layer in the dummy zone are equal to a width and a height of the second pixel defining layer in the active area zone, respectively, and
   wherein in a minor axis direction or major axis direction of the pixels, a distance between adjacent second pixel defining sub-layers in the dummy zone is larger than a distance between adjacent second pixel defining sub-layers in the active area zone.

2. The pixel defining layer according to claim 1, wherein a width of the first pixel defining sub-layer is larger than or equal to 15 µm.

3. The pixel defining layer according to claim 1, wherein a number of pixels in the dummy zone in a direction perpendicular to a periphery thereof is 1.

4. The pixel defining layer according to claim 1, wherein the first pixel defining sub-layer is an inorganic pixel defining sub-layer having lyophilicity, and the second pixel defining sub-layer is an organic pixel defining sub-layer having lyophobicity.

5. The pixel defining layer according to claim 4, wherein a material of the inorganic pixel defining sub-layer comprises one or more of silica, silicon nitride and silicon oxynitride, and a material of the organic pixel defining sub-layer comprises one or more of fluorinated polyimide, fluorinated polymethyl methacrylate, polysiloxane and a silicone resin.

6. An array substrate, comprising the pixel defining layer according to claim 1.

7. The array substrate according to claim 6, wherein the pixels in the dummy zone are dummy pixels.

8. A display apparatus, comprising the array substrate according to claim 6.

9. The display apparatus according to claim 8, wherein the pixels in the dummy zone are shielded by a frame of the display apparatus.

\* \* \* \* \*